United States Patent [19]
Greer et al.

[11] Patent Number: 5,597,737
[45] Date of Patent: Jan. 28, 1997

[54] METHOD FOR TESTING AND BURNING-IN A SEMICONDUCTOR WAFER

[75] Inventors: Stuart E. Greer; Joel P. Dietz; Aubrey K. Sparkman, all of Austin, Tex.

[73] Assignee: Motorola Inc., Schaumburg, Ill.

[21] Appl. No.: 552,448

[22] Filed: Nov. 3, 1995

[51] Int. Cl.⁶ ..................................... H01L 21/66
[52] U.S. Cl. ................. 437/8; 437/183; 437/226
[58] Field of Search ................. 437/8, 183, 189, 437/190, 226, 227; 148/DIG. 28, DIG. 162

[56] References Cited

U.S. PATENT DOCUMENTS

| | | | |
|---|---|---|---|
| 4,950,623 | 8/1990 | Dishon | 437/183 |
| 5,289,631 | 3/1994 | Koopman et al. | 437/8 |
| 5,470,787 | 11/1995 | Greer | 437/183 |
| 5,495,667 | 3/1996 | Farnworth et al. | 437/8 |

Primary Examiner—Chandra Chaudhari
Attorney, Agent, or Firm—Minh-Hein Clark

[57] ABSTRACT

Flip-chip is fast becoming the mounting method of choice in the semiconductor industry for dice having a high number of contacts. Since many applications require known-good-die, these flip-chip semiconductor dice must be tested and burned-in. By testing and burning-in the semiconductor wafers prior to solder bumping, the probe tips (42, 44, 46 & 48) can contact the hard planar surface of the under-bump-metallurgy (40) on each bonding pad (14) for easier and more reliable contact and hence test results. The probe tips can be either of an array (42 & 44) or cantilevered needle (46 & 48) type. Blunt probe tips (42 & 48) are well-suited to making contact on the shoulder of each bonding pad of each semiconductor die, while sharp probe tips (44 & 46) are preferable for contacting the center of each bonding pad. Solder bumping is performed post-testing.

19 Claims, 5 Drawing Sheets

METHOD FOR TESTING AND BURNING-IN A SEMICONDUCTOR WAFER

FIELD OF THE INVENTION

The present invention relates to a method for testing and burning-in a semiconductor wafer generally, and more specifically to a method for testing a pre-bump semiconductor wafer to provide known good die.

BACKGROUND OF THE INVENTION

Flip-chip bonding is one method currently used in the semiconductor industry to physically and electrically connect a semiconductor die to the next level of interconnection wiring. Solder bumps are deposited on the bonding pads of a semiconductor die, and these solder bumps are then soldered to traces on the next level interconnect to link the die's internal functional portions to the next level interconnect. Typically, solder bumping and wafer probe test is done at the wafer level before the die are sent to assembly and test.

There is a strong effort in the semiconductor industry for providing known good die (KGD) for flip-chip applications. This means that the semiconductor dice must be tested in order to verify functionality and then burned-in, usually by probing at an elevated temperature and with electrical bias to identify acceptable product. However, the presence of the solder bumps on the semiconductor wafer presents difficulties at both test and burning. Since the solder bumps are composed of lead and tin, they are fairly ductile and thus tend to deform during probing. This problem is exacerbated when the probing is done at elevated temperatures, because the solder bumps become even softer at the higher temperatures and deform more easily. A wafer reflow step can be performed after probing in an effort to regain the round bump shape, but if the deformation is extensive, the additional reflow step cannot cure this defect. In addition, the reflow step is a cost adder. Another problem with the present method of probing bumped semiconductor wafers is that bump height variations across the wafer can cause some false readings of failures so that good die may erroneously be discarded due to false test results. Furthermore, lead oxide ($Pb_xO_y$) from the solder bumps tends to stick to the probe tips thus requiring cleaning of the probe tips to eliminate the risk of contamination.

Thus a need exists for a method to easily test flip-chip semiconductor dice prior to assembly for KGD applications.

BRIEF DESCRIPTION OF THE DRAWINGS

Structural elements having the same or substantially similar functions are labeled using the same or like reference numerals.

DETAILED DESCRIPTION OF A PREFERRED EMBODIMENT

Generally, the present invention provides a method for testing and burning-in a semiconductor wafer of flip-chip dice without deforming the solder bumps which are used to provide external electrical interconnects on flip-chip dice. Testing is done on the hard planar surface of the under-bump-metallurgy prior to the solder bumps being deposited. A probe tip, configured either in an array or cantilevered arrangement, makes contact with the top layer of the under-bump-metallurgy, typically gold, on each bonding pad of each flip-chip die on the wafer. In this manner, known good die on the wafer level can be determined prior to the solder bumping process.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
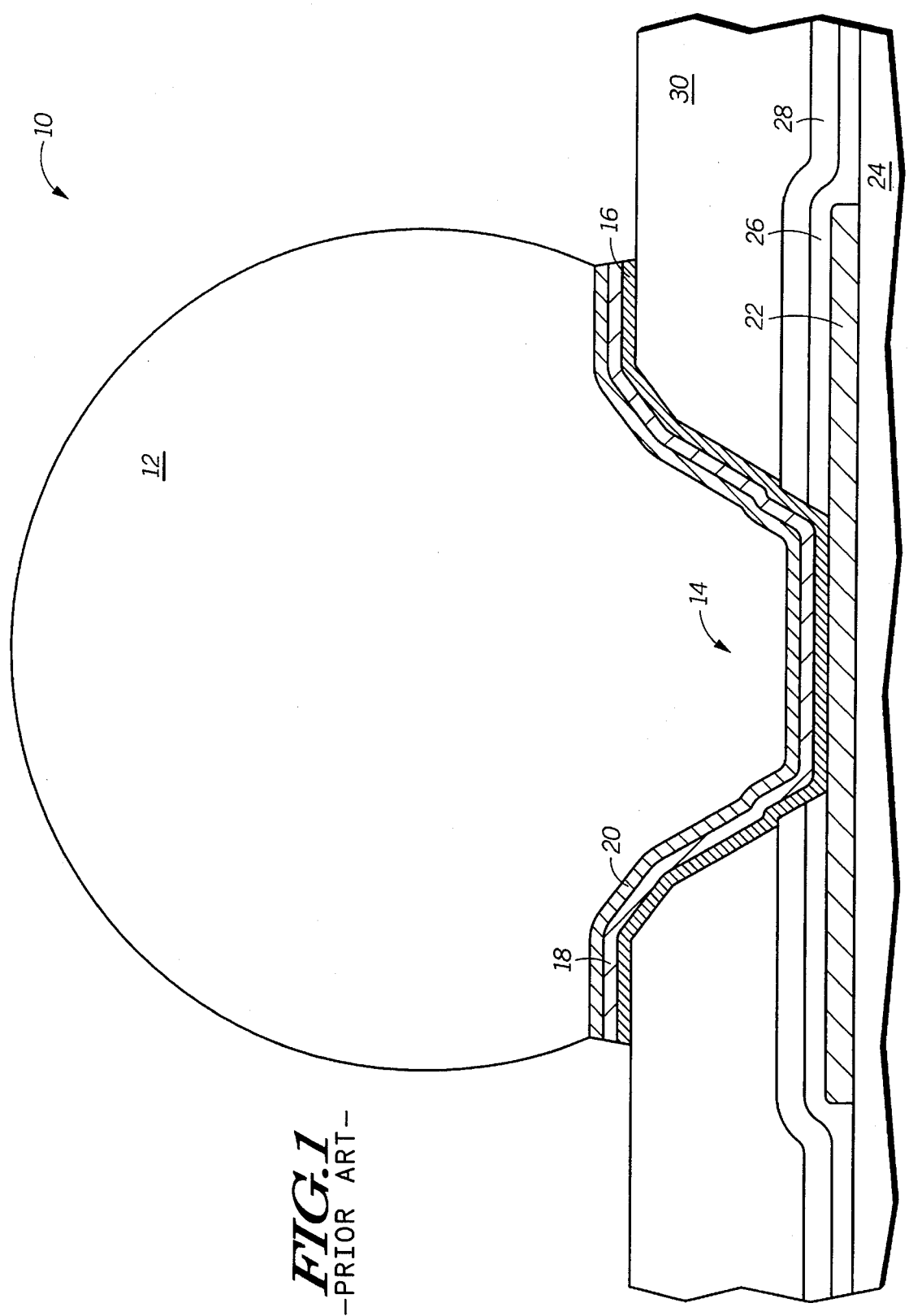
FIG. 1 illustrates, in cross-section, an enlarged view of a flip chip solder bump on a semiconductor die as known in the art.
Figure 2:
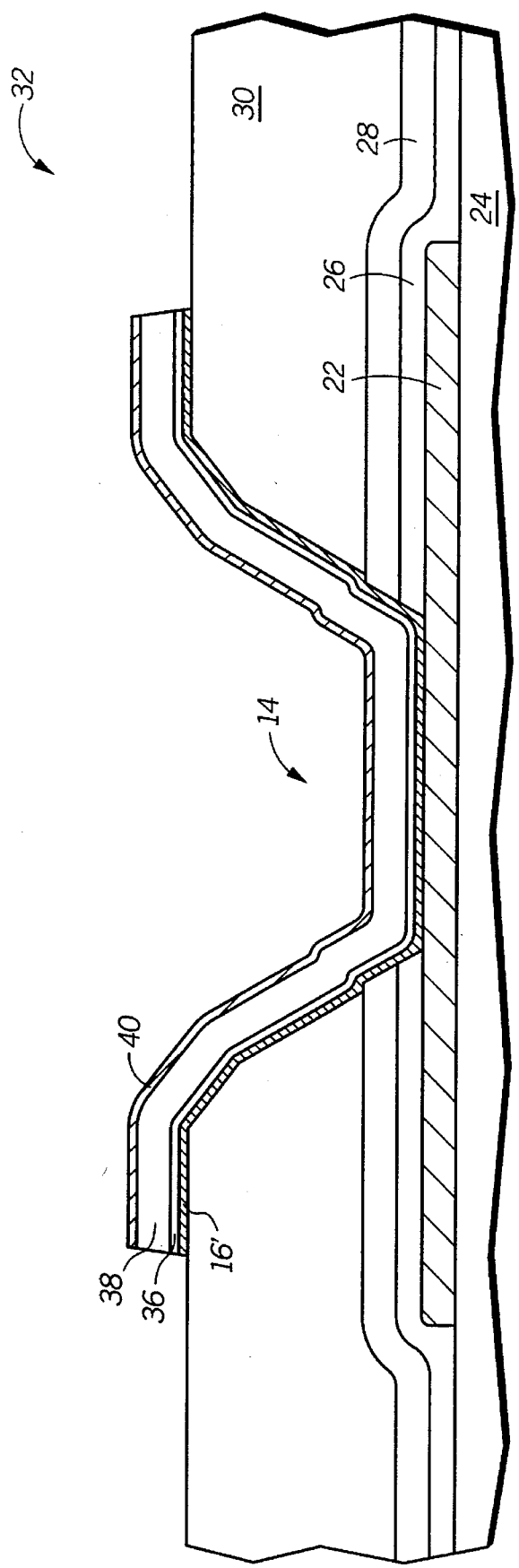
FIG. 2 illustrates, in cross-section, an enlarged view of an under-bump-metallurgy on a bond pad of a semiconductor die.

Illustrated in FIG. 2 is a cross-sectional view of a bonding pad 14 of a semiconductor die 32. The bonding pad 14 provides both the physical bond to the die surface and the electrical link into the actual circuitry of the semiconductor die. Additionally, the bonding pad provides an adhesive connection to the subsequently deposited solder bumps (as shown in FIG. 1). The bonding pad is usually prepared by selectively depositing a series of localized under-bump-metallurgies onto a semiconductor wafer. Alternatively, a blanket film of these materials can be deposited directly onto the wafer and then selectively etched to leave the wettable bonding pads in the selected areas, namely overlying the bonding pads. The metallurgy is typically composed of a chrome-copper-gold stack, although titanium or titanium/tungsten can be used as alternatives to chrome, and nickel can be used as an alternative to copper. The gold layer at the top of the stack prevents oxidation of the copper in the under bump metallurgy. The total thickness of the layers is typically approximately 5,000 to 20,000 Angstroms (Å). Although FIG. 2 only depicts a single bonding pad for clarity and ease of illustration, it should be understood that a complete semiconductor die would have a plurality of bonding pads corresponding to the number of electrical contacts on the device.

As illustrated by FIG. 2, the bonding pad 14 of the semiconductor die 32 is covered with a chrome-copper-gold under-bump-metallurgy (layers 16', 38 and 40, respectively) overlying metal line 22. In practice, there is a thin chrome-copper phase layer 36 between the chrome layer 16' and the copper layer 38. The under-bump-metallurgy can be deposited using conventional equipment and deposition techniques which are well known in the art. After the under-bump-metallurgy layers are formed but before the solder bumps are deposited, the semiconductor wafer can be tested or probed for opens and shorts, and then optionally burned-in, in accordance with the invention.

Figure 3:
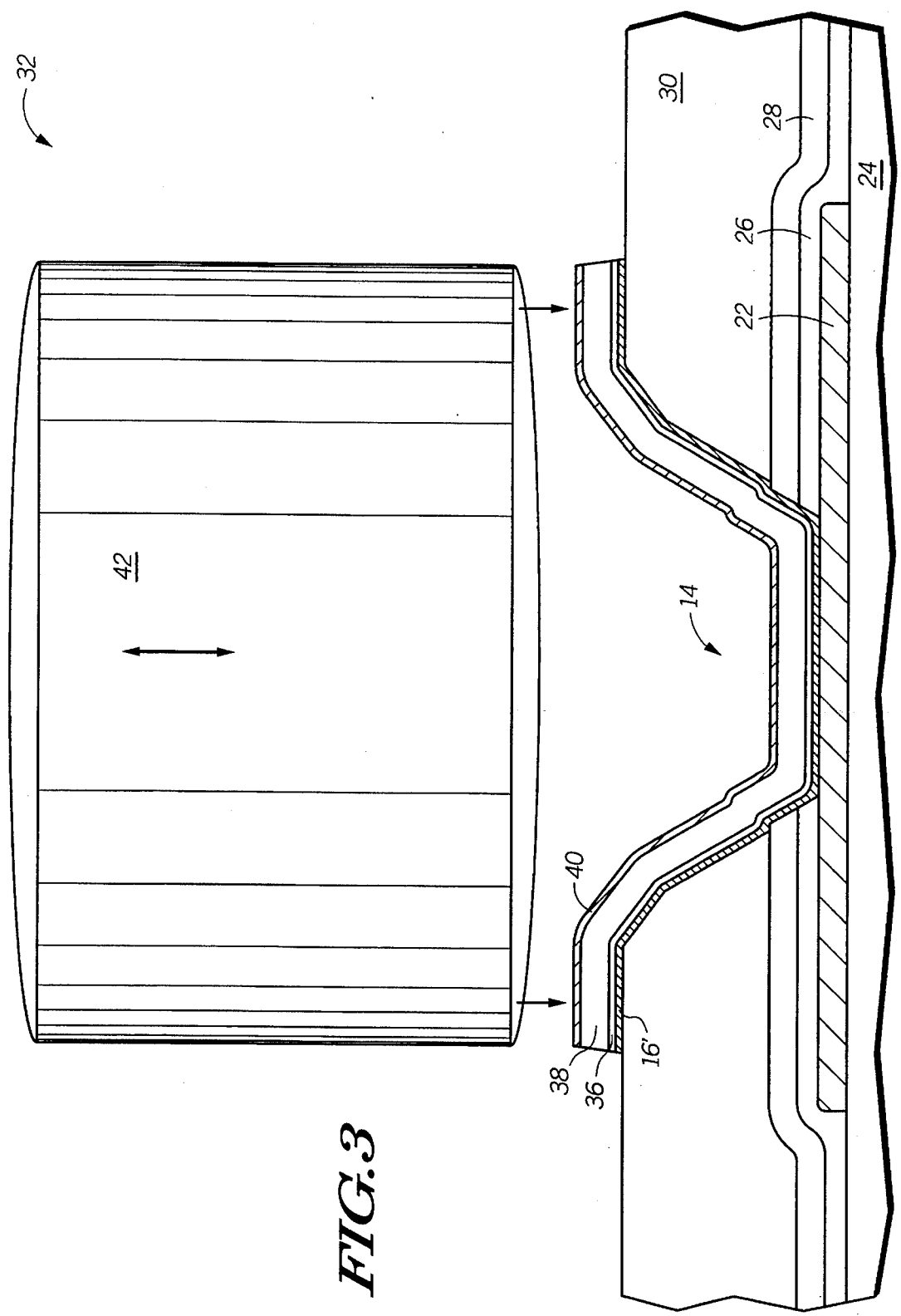
FIGS. 3–5 illustrate, in cross-section, various methods for testing the semiconductor die through contacting the under-bump-metallurgy in accordance with the invention.
Figure 4:
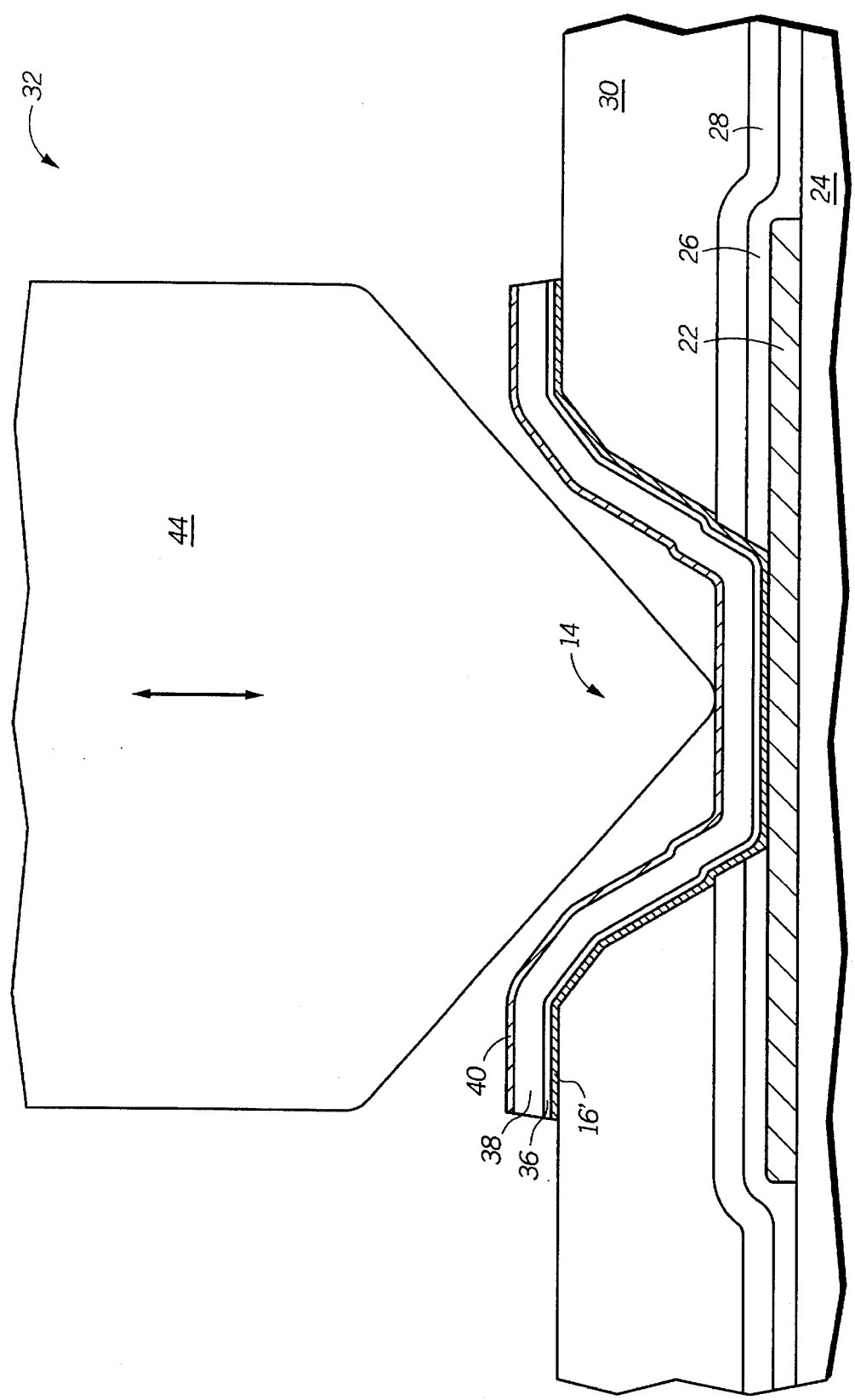
Figure 5:
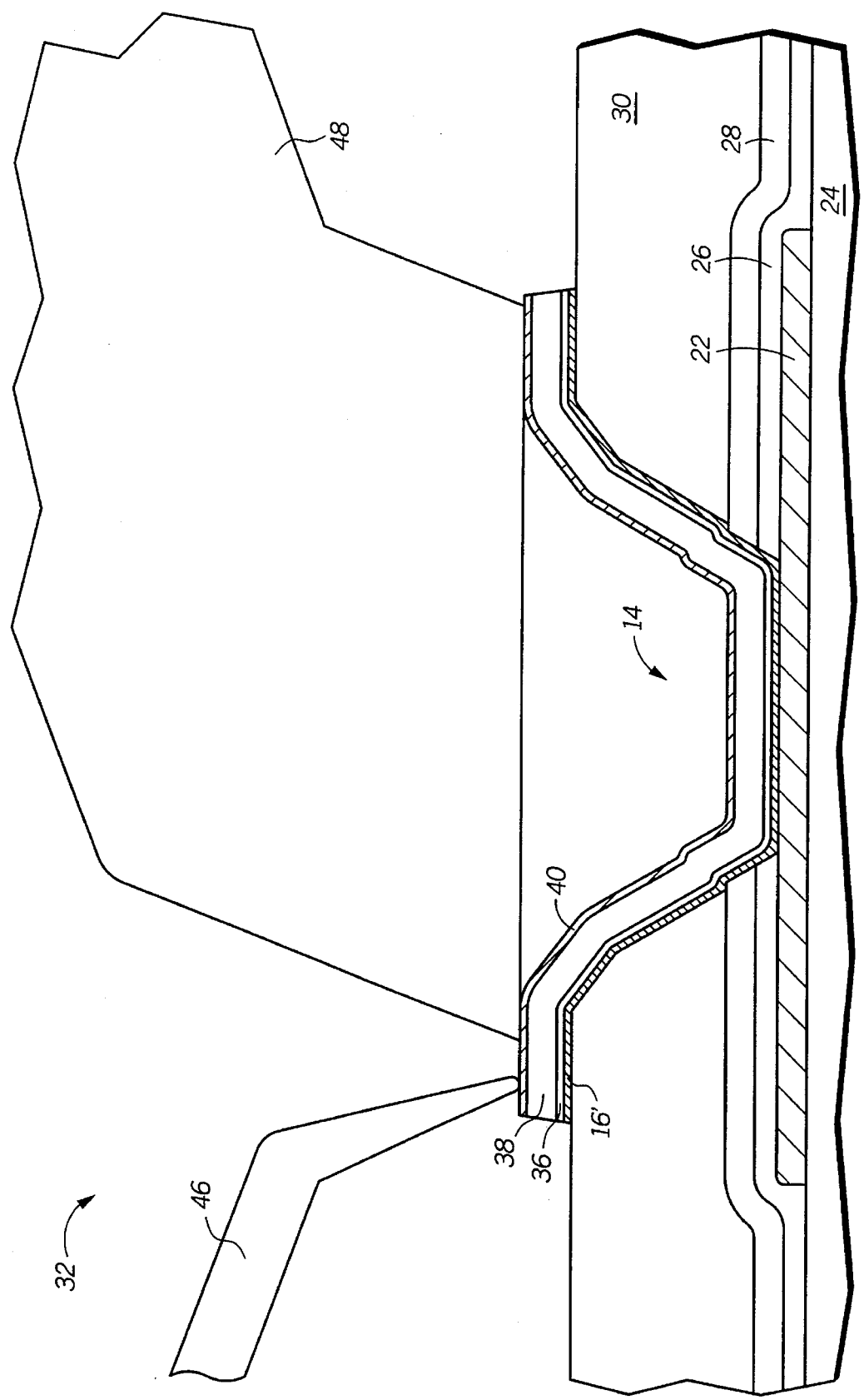

FIGS. 3–5 illustrate, in cross-section, various methods for testing the semiconductor die 32 through contacting the under-bump-metallurgy in accordance with the invention. In FIG. 3, a blunt array probe tip 42 is shown positioned above the bonding pad. What is not illustrated is the remainder of the testing equipment to which the array probe tip 42 is attached. The testing equipment can be any of the commercially available tester for purposes of practicing the present invention. As shown in FIG. 3, the blunt array probe tip would move downward to contact the shoulder portions of the bonding pad to test for open/short of the device. Since the top layer of the under-bump-metallurgy is gold which is non-contaminating, there is no risk of lead contamination of the probe tip, which is an advantage over the prior art method of probing the solder bumps. FIG. 4 illustrates a tapered array probe tip 44 which contacts the bonding pad 14. Because the probe tip 44 is tapered, it can contact the bonding pad in a central portion of the bonding pad. However, it is also possible for the tapered probe tip to contact the shoulder of the bonding pad 14 in a similar fashion to FIG. 3. For reliability reasons, it may be preferable to make contact on the shoulder portions of the bonding pad instead of within the trough of the pad.

FIG. 5 illustrates two other types of probe tips that may be used in practicing the present invention. In the left half of FIG. 5, a tapered and pointed tip 46 of a cantilevered probe needle is illustrated making contact with the top layer 40 of the under-bump-metallurgy on the bonding pad 14. This pointed tip 46 can have a typical tip radius of approximately 1.0 mil (25.4 μm) so as to be sufficiently rounded to prevent damage to the gold layer 40. In the right half of FIG. 5, a blunt tip 48 of a cantilevered probe needle is illustrated making contact with the top layer 40 of the under-bump-metallurgy. This blunt tip 48, typically 5 mils (127 μm) in width, has the advantage of having a larger contact area so that the placement of the needle tip does not need to be as tightly and precisely controlled as the pointed tip 46. However, the pointed tip 46 would be advantageous over the blunt tip 48 for contacting the bonding pad in the central portion or trough of the bonding pad as opposed to contacting it on the shoulder as shown.

In an optional step, the semiconductor wafer can undergo an oxygen ash if required to reduce surface leakage. This oxygen ash can be performed either after the semiconductor wafer has been tested at the wafer level by probing the under-bump-metallurgy and the good semiconductor dice on the wafer have been mapped, or the oxygen ash can be done after the under-bump-metallurgy has been formed but prior to wafer probe. In any event, an oxygen ash is intended to reduce current leakage between bonding pads by removing any organic contamination, such as carbonized polyimide, that occurs in the topmost layers of the polyimide layer 30. This oxygen ash is performed in the prior art on bumped wafers to reduce this surface leakage between solder bumps. A problem with the prior art method, however, is that the oxygen ash forms a thick oxide on the solder bumps which then adheres to the probe tips during test and burn-in causing contamination of the probes. Additionally, the presence of this oxide requires the use of an aggressive flux at assembly to achieve good wetting of the bumps to the next level interconnect. An advantage to performing the oxygen ash on semiconductor wafers prior to solder bumping, in accordance with the present invention, is that there are no solder bumps to oxidize. Hence, an aggressive flux cleaning step is not required at assembly thus eliminating a problem source causing marginal joining.

After the semiconductor dice have been tested in wafer form via probing the hard planar surface of the under-bump-metallurgy, either on the shoulder of the bonding pad or in the trough of the bonding pad, and after the oxygen ash is performed (if required), and after wafer-level burn-in is performed (if required), solder bumps can be deposited on the bonding pads of all the devices that passed testing and, optionally, burning-in to provide bumped known-good-die as desired in the semiconductor industry. Methods of forming traditional solder bumps are known in the art. In addition, methods for forming solder bumps having intrinsic potential for forming an extended eutectic region is disclosed in an allowed patent application, Ser. No. 08/236,320, now U.S. Pat. No. 5,470,787 by Stuart E. Greer, filed May 2, 1994, the teachings of which are herein incorporated by reference.

The foregoing description and illustrations contained herein demonstrate many of the advantages associated with the present invention. In particular, it has been revealed that a method for testing and burning-in a semiconductor wafer of flip-chip dice is possible without encountering any of the problems of damaged solder bumps as a result of wafer probe and burn-in. Practicing the present invention provides tested semiconductor devices for known-good-die applications. By testing the semiconductor wafer prior to the formation of the solder bumps, all the attendant problems of deforming or damaging the solder bumps are eliminated. Additionally, contamination of the probe tips with lead or lead oxide from the solder bumps is also eliminated because the probe tips contact a hard gold surface instead of ductile tin-lead solder bumps.

Thus it is apparent that there has been provided, in accordance with the invention, a method for testing and burning-in a wafer of flip-chip semiconductor dice that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is in no way limited to any particular type of semiconductor die but can include any device that is designed to be flip-chip mounted so that an under-bump-metallurgy is present for probing. Furthermore, while contact of the probe tips onto the under-bump-metallurgy of each bonding pad is preferably located on either the flat shoulder area or in the trough of the bonding pads, it may be possible to achieve contact on the sidewall of the bonding pad, especially if a sharp or pointed probe tip is used. Additionally, the top layer of the under-bump-metallurgy is not limited to gold but may be another metal or any anti-oxidant barrier as long as it allows good joining between the under-bump-metallurgy and the solder bump. Therefore, it is intended that this invention encompass all such variations and modifications falling within the scope of the appended claims.

We claim:

1. A method for testing a semiconductor wafer, comprising the steps of:

providing a semiconductor wafer containing a plurality of semiconductor dice, each semiconductor die having a plurality of bonding pads, wherein the semiconductor wafer has a top layer of an under-bump-metallurgy overlying the plurality of bonding pads; and contacting the plurality of bonding pads via the top layer of the under-bump-metallurgy with a probe tip of a tester to determine whether each semiconductor die on the semiconductor wafer is functional.

2. The method of claim 1, wherein the step of contacting is performed using a probe tip selected from a group consisting of: a blunt array probe tip, a tapered array probe tip, a blunt-tip cantilevered probe needle, and a pointed-tip cantilevered probe needle.

3. The method of claim 2, wherein the step of contacting contacts the top layer of the under-bump-metallurgy disposed on a shoulder of each bonding pad.

4. The method of claim 2, wherein the step of contacting contacts the top layer of the under-bump-metallurgy disposed in a central portion of each bonding pad.

5. The method of claim 1, further comprising the step of dicing the semiconductor wafer into individual semiconductor dice after the step of contacting.

6. The method of claim 1, further comprising the step of performing an oxygen ash on the semiconductor wafer.

7. The method of claim 1, further comprising the step of depositing a plurality of solder bumps on the plurality of bonding pads of each semiconductor die after the step of contacting.

8. The method of claim 1, further comprising the step of burning-in the semiconductor wafer prior to solder bumping said semiconductor wafer.

9. A method for testing a semiconductor wafer, comprising the steps of:

provideng a semiconductor wafer containing a plurality of semiconductor dice, each semiconductor die having a plurality of bonding pads, wherein the semiconductor wafer has a top layer of an under-bump-metallurgy overlying the plurality of bonding pads;

contacting the plurality of bonding pads via the top layer of the under-bump-metallurgy with an array probe tip to determine whether each semiconductor die on the semiconductor wafer is functional; and depositing a plurality of solder bumps on the plurality of bonding pads of each semiconductor die after the step of contacting the plurality of bonding pads.

10. The method of claim 9, wherein the step of contacting is performed using a blunt array probe tip which contacts the top layer of the under-bump-metallurgy disposed on a shoulder of each of the plurality of bonding pads.

11. The method of claim 9, wherein the step of contacting is performed using a sharp array probe tip which contacts the top layer of the under-bump-metallurgy disposed on a shoulder of each of the plurality of bonding pads.

12. The method of claim 9, wherein the step of contacting is performed using a sharp array probe tip which contacts the top layer of the under-bump-metallurgy disposed on a central portion of each of the plurality of bonding pads.

13. The method of claim 9, further comprising the step of performing an oxygen ash on the semiconductor wafer.

14. A method for testing a semiconductor wafer, comprising the steps of:

providing a semiconductor wafer containing a plurality of semiconductor dice, each semiconductor die having a plurality of bonding pads, wherein the semiconductor wafer has a top layer of an under-bump-metallurgy overlying the plurality of bonding pads;

contacting the plurality of bonding pads via the top layer of the under-bump-metallurgy with a tip of a cantilevered probe needle to determine whether each semiconductor die on the semiconductor wafer is functional; and depositing a plurality of solder bumps on the plurality of bonding pads of each semiconductor die after the step of contacting the plurality of bonding pads.

15. The method of claim 14, wherein the step of contacting is performed using a blunt tip which contacts the top layer of the under-bump-metallurgy disposed on a shoulder of each of the plurality of bonding pads.

16. The method of claim 14, wherein the step of contacting is performed using a blunt tip which contacts the top layer of the under-bump-metallurgy disposed on a central portion of each of the plurality of bonding pads.

17. The method of claim 14, wherein the step of contacting is performed using a pointed tip, having a radius, which contacts the top layer of the under-bump-metallurgy disposed on a shoulder of each of the plurality of bonding pads.

18. The method of claim 14, wherein the step of contacting is performed using a pointed tip, having a radius, which contacts the top layer of the under-bump-metallurgy disposed on a central portion of each of the plurality of bonding pads.

19. The method of claim 14, further comprising the step of performing an oxygen ash on the semiconductor wafer.

* * * * *